US012739731B2

(12) United States Patent
Thommana et al.

(10) Patent No.: US 12,739,731 B2
(45) Date of Patent: Sep. 15, 2026

(54) HF ELECTRIC FIELD RYDBERG SENSOR

(71) Applicant: Rockwell Collins, Inc., Cedar Rapids, IA (US)

(72) Inventors: John V. Thommana, Cedar Rapids, IA (US); Raymond Zanoni, Marion, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 393 days.

(21) Appl. No.: 18/389,108

(22) Filed: Nov. 13, 2023

(65) Prior Publication Data

US 2025/0081082 A1 Mar. 6, 2025

Related U.S. Application Data

(63) Continuation-in-part of application No. 18/238,814, filed on Aug. 28, 2023, now Pat. No. 12,641,513.

(51) Int. Cl.
*H04W 40/24* (2009.01)
*G01R 29/12* (2006.01)
*H04W 84/18* (2009.01)

(52) U.S. Cl.
CPC .......... *H04W 40/246* (2013.01); *G01R 29/12* (2013.01); *H04W 84/18* (2013.01)

(58) Field of Classification Search
CPC ..... H04W 40/246; H04W 84/18; G01R 29/12
See application file for complete search history.

(56) References Cited

U.S. PATENT DOCUMENTS 9,210,067 B1 * 12/2015 Agarwal ................. H04L 45/03
10,509,065 B1 12/2019 Shaffer
11,674,991 B2 6/2023 Cox et al.
2003/0086425 A1 * 5/2003 Bearden .............. H04L 43/0876 370/392
2006/0245424 A1 * 11/2006 Ramanathan ......... H04W 40/00 370/389
2008/0129610 A1 6/2008 Tsfati et al.
2009/0180573 A1 * 7/2009 Thesling ............... H04L 25/022 375/296
2010/0156665 A1 * 6/2010 Krzyzanowski ....... G01D 4/004 340/870.02
2011/0170859 A1 7/2011 Conklin et al.
2016/0135111 A1 * 5/2016 Huang .................. H04W 76/14 370/254

(Continued)

FOREIGN PATENT DOCUMENTS

CN 110249634 A 9/2019
CN 113376446 A 1/2022

(Continued)

*Primary Examiner* — Tejis Daya
(74) *Attorney, Agent, or Firm* — Suiter Swantz IP

(57) ABSTRACT

An HF mesh network node includes an Electric Field Rydberg sensor as a compact broadband HF antenna. The Electric Field Rydberg sensor ensures that the receiver has visibility of a large band of HF spectrum and can therefore receive all propagating frequencies in that band simultaneously. The system may receive control information via the Rydberg sensor to establish a direct connection with a distant node via a traditional coupler and antenna on a specific frequency. The system may include a plurality of Rydberg sensors, each specifically tuned to cover a 10 MHz range of an extended spectrum.

17 Claims, 3 Drawing Sheets

(56) References Cited

U.S. PATENT DOCUMENTS

| | | | | |
|---|---|---|---|---|
| 2018/0351857 | A1* | 12/2018 | Vairavakkalai | H04L 63/0272 |
| 2019/0150001 | A1* | 5/2019 | Jen | H04L 43/16 455/446 |
| 2022/0131601 | A1 | 4/2022 | Mayer | |
| 2023/0221406 | A1 | 7/2023 | Bucklew et al. | |
| 2023/0243881 | A1 | 8/2023 | Anderson et al. | |
| 2025/0258211 | A1* | 8/2025 | Burton | H04B 10/25752 |

FOREIGN PATENT DOCUMENTS

| | | | |
|---|---|---|---|
| CN | 114441852 | A | 5/2022 |
| EP | 3930229 | A1 | 12/2021 |
| EP | 4107541 | A4 | 12/2022 |
| EP | 4121786 | A4 | 1/2023 |
| GB | 2597260 | B | 12/2022 |
| GB | 2606167 | B | 6/2023 |

* cited by examiner

HF ELECTRIC FIELD RYDBERG SENSOR

PRIORITY

The present application claims the benefit under 35 U.S.C. § 120 of U.S. patent application Ser. No. 18/238,814 (filed Aug. 28, 2023), which is incorporated herein by reference.

BACKGROUND

High frequency (HF) operations require large antennas. For example, at three megahertz, a system would require a minimum thirty-foot antenna. A typical broadband antenna for large fixed-site stations may by 110 ft (34 m) and constrain impedance mismatch loss to 2:1 (the impedance mismatch loss across the HF frequency band, two to thirty MHz, is less than 0.5 dB even with no antenna coupler).

Such antennas are too large for mobile platforms. Mobile platforms utilize electrically short antennas with highly variable impedance across the HF band. In order to efficiently couple the transmitted power from the power amplifier to the antenna, an impedance matching device known as an HF coupler is used. Existing HF couplers limit impedance mismatch loss to less than 0.17 dB, but at the expense of instantaneous bandwidth; and the HF coupler is only 70% efficient (i.e., it burns 30% of the power exchanged internal to the coupler in the form of heat).

To implement an ad-hoc HF mesh network, each HF node must have a spectral sensor. The spectrum sensor must be able to access the entire HF spectrum to detect all propagating frequencies from all participants in the network, but the HF coupler limits the spectral view of the sensor. In an HF mesh network with mobile nodes using an HF coupler, the coupler bandwidth is around 3 kHz at 2 MHz and bandwidths of 48 kHz can only be supported for frequencies above 11 MHz. The maximum coupler bandwidth supportable at 30 MHz is less than 100 kHz. Certain network requirements can only be satisfied via a hub and spoke network with fixed site nodes being the central hubs with spectral sensors. The HF coupler at all disadvantaged nodes limits the spectral view of the spectral sensor to the coupler bandwidth around the tuned frequency. In contested theaters, such architecture is unsupportable.

To have full band spectral visibility, the antenna has to be broadband, and have a constant impedance across the band to obviate a coupler with limited spectral bandwidth to transmit and/or receive HF communication.

SUMMARY

In one aspect, embodiments of the inventive concepts disclosed herein are directed to an HF mesh network system including an Electric Field Rydberg sensor as a compact broadband HF antenna. The Electric Field Rydberg sensor ensures that the receiver has visibility of a large band of HF spectrum and can therefore receive all propagating frequencies in that band simultaneously.

In a further aspect, the system may receive control information via the Rydberg sensor to establish a direct connection with a distant node via a traditional antenna on a specific frequency.

In a further aspect, the system may include a plurality of Rydberg sensors, each specifically tuned to cover a 10 MHz range of an extended spectrum.

It is to be understood that both the foregoing general description and the following detailed description are exemplary and explanatory only and should not restrict the scope of the claims. The accompanying drawings, which are incorporated in and constitute a part of the specification, illustrate exemplary embodiments of the inventive concepts disclosed herein and together with the general description, serve to explain the principles.

BRIEF DESCRIPTION OF THE DRAWINGS

The numerous advantages of the embodiments of the inventive concepts disclosed herein may be better understood by those skilled in the art by reference to the accompanying figures in which.

DETAILED DESCRIPTION

Figures 1A, 1B:
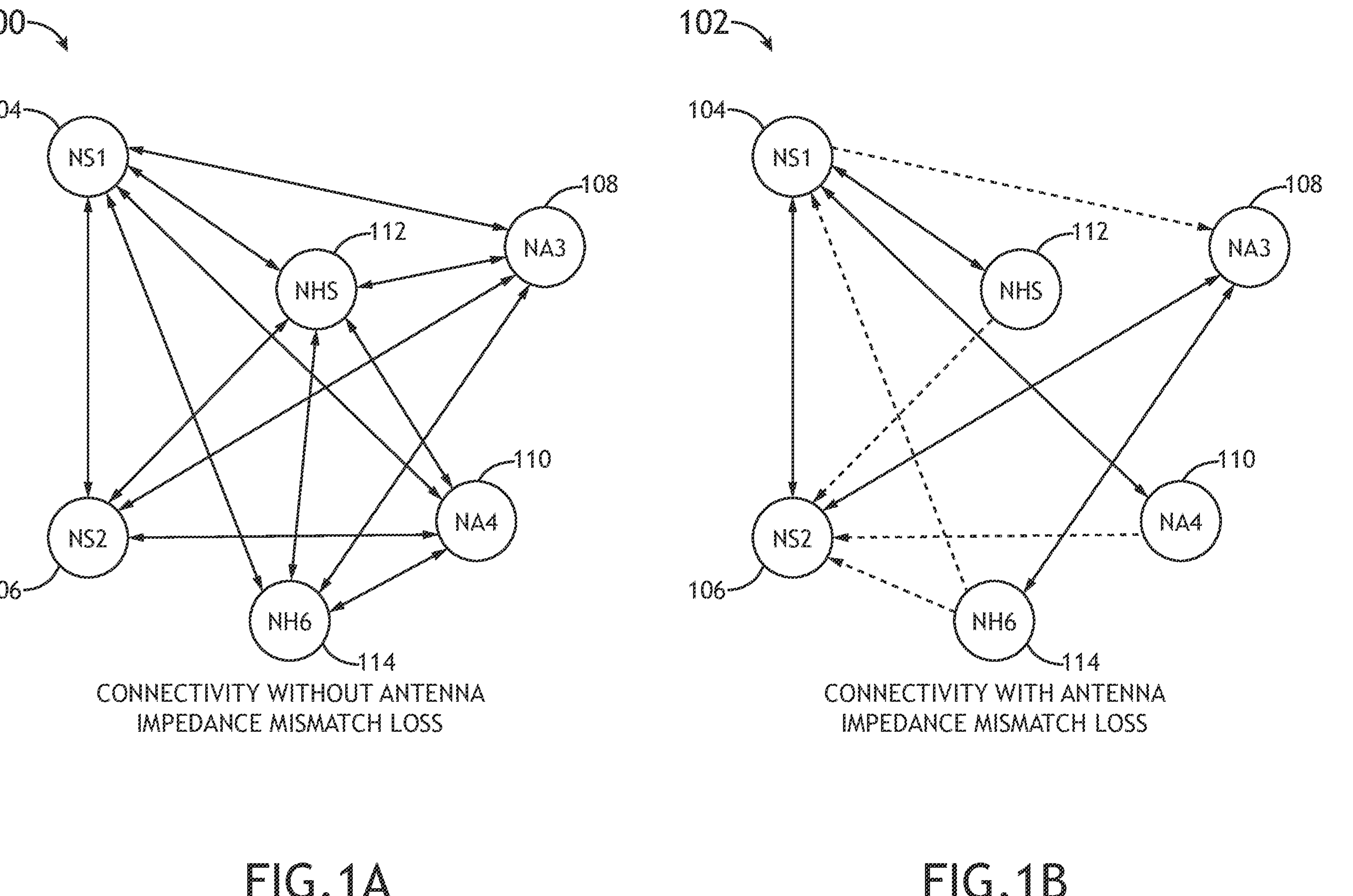
FIG. 1A shows a block diagram of a mesh network according to an exemplary embodiment.
FIG. 1B shows a block diagram of a mesh network according to an exemplary embodiment.

Before explaining various embodiments of the inventive concepts disclosed herein in detail, it is to be understood that the inventive concepts are not limited in their application to the arrangement of the components or steps or methodologies set forth in the following description or illustrated in the drawings. In the following detailed description of embodiments of the instant inventive concepts, numerous specific details are set forth in order to provide a more thorough understanding of the inventive concepts. However, it will be apparent to one of ordinary skill in the art having the benefit of the instant disclosure that the inventive concepts disclosed herein may be practiced without these specific details. In other instances, well-known features may not be described in detail to avoid unnecessarily complicating the instant disclosure. The inventive concepts disclosed herein are capable of other embodiments or of being practiced or carried out in various ways. Also, it is to be understood that the phraseology and terminology employed herein is for the purpose of description and should not be regarded as limiting.

As used herein a letter following a reference numeral is intended to reference an embodiment of a feature or element that may be similar, but not necessarily identical, to a previously described element or feature bearing the same reference numeral (e.g., 1, 1*a*, 1*b*). Such shorthand notations are used for purposes of convenience only, and should not be construed to limit the inventive concepts disclosed herein in any way unless expressly stated to the contrary.

Further, unless expressly stated to the contrary, "or" refers to an inclusive or and not to an exclusive or. For example, a condition A or B is satisfied by anyone of the following: A is true (or present) and B is false (or not present), A is false (or not present) and B is true (or present), and both A and B are true (or present).

In addition, use of "a" or "an" are employed to describe elements and components of embodiments of the instant inventive concepts. This is done merely for convenience and to give a general sense of the inventive concepts, and "a" and "an" are intended to include one or at least one and the singular also includes the plural unless it is obvious that it is meant otherwise.

Also, while various components may be depicted as being connected directly, direct connection is not a requirement.

Components may be in data communication with intervening components that are not illustrated or described.

Finally, as used herein any reference to "one embodiment," or "some embodiments" means that a particular element, feature, structure, or characteristic described in connection with the embodiment is included in at least one embodiment of the inventive concepts disclosed herein. The appearances of the phrase "in at least one embodiment" in the specification does not necessarily refer to the same embodiment. Embodiments of the inventive concepts disclosed may include one or more of the features expressly described or inherently present herein, or any combination or sub-combination of two or more such features.

Broadly, embodiments of the inventive concepts disclosed herein are directed an HF mesh network system including an Electric Field Rydberg sensor as a compact broadband HF antenna. The Electric Field Rydberg sensor ensures that the receiver has visibility of a large band of HF spectrum and can therefore receive all propagating frequencies in that band simultaneously. The system may receive control information via the Rydberg sensor to establish a direct connection with a distant node via a traditional antenna on a specific frequency. The system may include a plurality of Rydberg sensors, each specifically tuned to cover a 10 MHz range of an extended spectrum.

Referring to FIGS. 1A-1B, block diagrams of a mesh network 100, 102 according to an exemplary embodiment are shown. Where an HF coupler with an impedance matching element is used (as illustrated in FIG. 1A), nodes 104, 106, 108, 110, 112, 114 can support bidirectional communication between all nodes using one of more of the frequencies allocated to it. However, with impedance mismatch loss (as illustrated in FIG. 1B), the connectivity map between the nodes 104, 106, 108, 110, 112, 114 can change drastically depending on the antenna used. It can be seen that some bi-directional communication links can become unidirectional, depicted by dashed arrows indicating the direction of communication possible. It can also be seen that sometimes no communication is possible even though bi-directional communication was possible when communicating via the coupler.

Every node 104, 106, 108, 110, 112, 114 may be associated with one or more antenna configuration files. A node 104, 106, 108, 110, 112, 114 can be associated with multiple antenna configuration files because some platforms may have multiple HF antennas and antennas on some platforms are differently configurable, the appropriate antenna configuration file may be selected for a given mission. In at least one embodiment, an antenna configuration may be defined by the frequency, gain, and mismatch loss in dB. Antenna gain values may be averaged values that may have +/−5 dB variation due to angular variation in the antenna pattern. Antenna gain varies depending on the direction of the destination node, launch angle, frequency, etc. In at least one embodiment, antenna gain configuration may be dependent on azimuth or elevation angles and frequency. A gain table may have multiple frequency and angle pairs to obtain a better antenna gain. Because communication often relies on different elevation angles between nodes, it may be impossible to find a single frequency where all nodes will be able to communicate. It is desirable for nodes to be able to hear on all frequencies.

Figure 2:
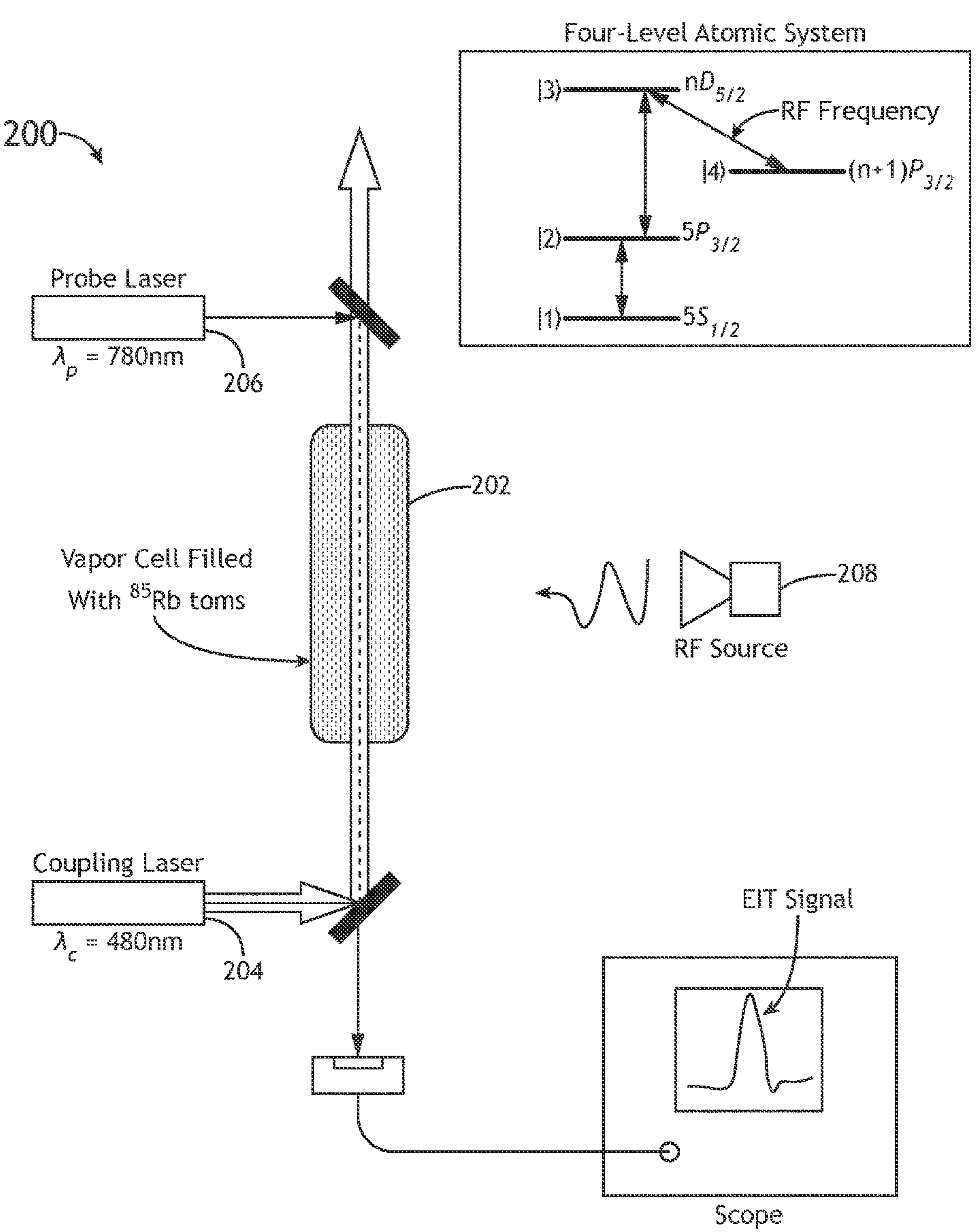
FIG. 2 shows a Rydberg sensor suitable for use in an exemplary embodiment.

Referring to FIG. 2, a Rydberg sensor suitable for use in an exemplary embodiment is shown. An Electric Field Rydberg sensor 200 is a broadband quantum atomic receive antenna. Rydberg sensors 200 exploit properties of Rydberg atoms to create a small broadband antenna with large dipole moments. Using Rydberg atoms (like Rubidium, Cesium, or the like) an antenna may be much smaller than traditional antennas used on mobile platforms, but with the performance of a much larger physical antenna. Large dipole moments make the Rydberg sensor 200 highly sensitive to electric fields from RF emissions. A photodetector 208 can be used to extract the effect of the RF field on the Rydberg sensor 200.

Rydberg sensors 200 utilize lasers 204, 206 to excite electrons in a vapor tube 202. As the electrons in the vapor atoms move away from the nucleus, they become more sensitive to external electric fields. A Rydberg sensor 200 enables broadband reception of all frequencies within the 10 MHz band of interest. The difference in the excitation levels of the Rydberg atoms ensures that electric field of the RF source exposed to the Rydberg sensor 200 can be extracted.

The RF spectrum that can be received is dependent on the lasers 204, 206; the lasers 204, 206 drive the vapor to a state where the atoms are more sensitive to a certain frequency band. The combination of the probe laser 206 frequency and coupling laser 204 frequency determines the RF spectrum being targeted. It may be appreciated that while the Rydberg sensor 200 shown depicts lasers 204, 206 passing linearly through the vapor tube 202, the laser may enter the vapor tube 202 at an angle and reflect off the edges to excite more electrons. Sensitivity of Rydberg sensor 200 is of the order of 1E-3 V/m. For a 1 mm×1 cm interaction region and the measured sensitivity of 79 μV/m/√Hz, the estimated power sensitivity is approximately −131 dBm in a 1 Hz bandwidth. Such antennas may be smaller than traditional antennas for the same application.

In at least one embodiment, the sensitivity of the Rydberg sensor 200 may be improved by using multi-atom, multi-pass sensors. Sensitivities as low as 3 μV/cm/√Hz have been demonstrated at mm wave frequencies. Similar improvements may be achieved in the MHz bands. Existing Rydberg sensors may be less sensitive than traditional HF antennas and this loss of sensitivity has to be accounted for.

In at least one embodiment, the system may be optimized for performance within a range of about 5 MHz to 22 MHz. In a system configured to operate across a 17 MHz range, two Rydberg sensors 200 may be disposed and configured to cover the entire range. Such a system would be smaller than a traditional antenna system, and without impedance mismatch loss.

Embodiments utilizing Rydberg sensors 200 may have reduced range as compared to traditional antennas tuned for the same application. In at least one embodiment, point-to-point transmissions may utilize a traditional, standard antenna that may include a coupler. Operations on a specific frequency may be better suited to traditional antennas with a coupler to avoid any impedance mismatch loss and range. However, control information may be received via the Rydberg sensor 200 to cover a wide band of potential frequencies when the receiver does not know what frequency will be utilized.

The sensitivity differential between the two antennas results in communication range loss when receiving via a Rydberg sensor 200. This forces the system to relay control information via intervening neighbors. While it may be possible for nodes to communicate via a relay node, such communication is inefficient. It is desirable to communicate directly if possible. The system may determine if the nodes can communicate directly if both were utilizing a traditional antenna and coupler. The nodes may share control information via a first order neighbor to establish a frequency and time when the nodes can communicate directly via coupler connected antenna, and then switch to a direct communication mode.

Figure 3:
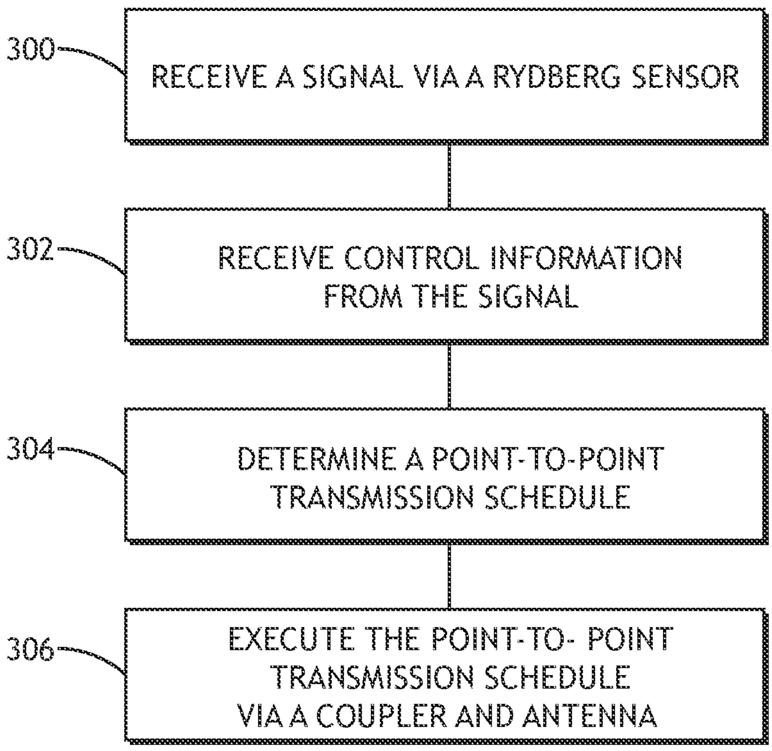
FIG. 3 shows a flowchart of a method according to an exemplary embodiment.

Referring to FIG. 3, a flowchart of a method according to an exemplary embodiment is shown. A node in a mobile network may include one or more Rydberg sensors tuned to receive 200 signals within a range (or several discrete ranges) or operating frequencies. The node receives 302 control information via the signals, and establish routing tables and frequencies to establish connections to other nodes in the network.

The node may determine 304 a point-to-point transmission schedule with another node in the network via broad spectrum communication through the Rydberg sensors. Such communication may be on any frequency within the range. In at least one embodiment, control information from the Rydberg sensors may be relayed via neighboring nodes in the network.

Once a point-to-point transmission schedule is established, each point-to-point node may execute 306 the schedule via narrow spectrum communication through a coupler and antenna.

Embodiments of the present disclosure enable a node to listen on all of a range of frequencies without significant impedance mismatch loss. Nodes can achieve ad-hoc communication over a very wide geographical region, with many nodes communicating.

Embodiments of the disclosure enable separate auxiliary Rydberg sensor on every platform for opportunistic receive functions but communicate via a coupler for the main antenna. This way all two-way communication is via the coupler, incurring a penalty of less than 0.5 dB whereas tracking opportunistic relays is done via the Rydberg sensor.

It is believed that the inventive concepts disclosed herein and many of their attendant advantages will be understood by the foregoing description of embodiments of the inventive concepts, and it will be apparent that various changes may be made in the form, construction, and arrangement of the components thereof without departing from the broad scope of the inventive concepts disclosed herein or without sacrificing all of their material advantages; and individual features from various embodiments may be combined to arrive at other embodiments. The forms herein before described being merely explanatory embodiments thereof, it is the intention of the following claims to encompass and include such changes. Furthermore, any of the features disclosed in relation to any of the individual embodiments may be incorporated into any other embodiment.

What is claimed is:

1. A high frequency (HF) system comprising:
- at least one Rydberg sensor;
- at least one processor in data communication with the at least one Rydberg sensor and a memory storing processor executable code for configuring the at least one processor to:
  - receive one or more signals from other nodes in the mesh network via the at least one Rydberg sensor;
  - receive control information via the one or more signals; and
  - produce a routing table based on the control information,
- wherein each entry in the routing table comprises a frequency, a link margin, and a connectivity direction.

2. The system of claim 1, wherein the routing table comprises separate entries for transmit and receive.

3. The system of claim 1, wherein the routing table comprises both direct and indirect routing.

4. The system of claim 1, further comprising an antenna and a coupler, wherein the at least one processor is further configured to:
- determine a communication schedule with another node in the mesh network via control information through the Rydberg sensor; and
- establish point-to-point contact with the other node via the antenna and coupler configured for a narrow frequency.

5. The system of claim 4, wherein the communication schedule is negotiated via relay through a neighboring node.

6. The system of claim 5, wherein the at least one Rydberg sensor comprises a first Rydberg sensor configured for a first spectrum range and a second Rydberg sensor configured for a second spectrum range.

7. A high frequency (HF) mesh network system comprising:
- a plurality of HF nodes, each comprising:
  - at least one Rydberg sensor;
  - at least one processor in data communication with the at least one Rydberg sensor and a memory storing processor executable code for configuring the at least one processor to:
    - receive one or more signals from other nodes in the mesh network via the at least one Rydberg sensor;
    - receive control information via the one or more signals;
    - produce a routing table based on the control information;
    - determine a communication schedule with another node in the mesh network via control information through the Rydberg sensor; and
    - establish point-to-point contact with the other node via the antenna and coupler configured for a narrow frequency.

8. The system of claim 7, wherein the routing table comprises separate entries for transmit and receive.

9. The system of claim 7, wherein each entry in the routing table comprises a frequency, a link margin, and a connectivity direction.

10. The system of claim 7, wherein the routing table comprises both direct and indirect routing.

11. The system of claim 7, wherein the communication schedule is negotiated via relay through a neighboring node.

12. The system of claim 11, wherein the at least one Rydberg sensor comprises a first Rydberg sensor configured for a first spectrum range and a second Rydberg sensor configured for a second spectrum range.

13. A computer apparatus embodied in a high frequency (HF) node in a mesh network comprising:
- at least one Rydberg sensor;
- at least one processor in data communication with the at least one Rydberg sensor and a memory storing processor executable code for configuring the at least one processor to:
  - receive one or more signals from other nodes in the mesh network via the at least one Rydberg sensor;
  - receive control information via the one or more signals; and
  - produce a routing table based on the control information,
- wherein each entry in the routing table comprises a frequency, a link margin, and a connectivity direction.

14. The computer apparatus of claim 13, wherein the routing table comprises separate entries for transmit and receive.

15. The computer apparatus of claim 13, wherein the routing table comprises both direct and indirect routing.

16. The computer apparatus of claim 13, further comprising an antenna and a coupler, wherein the at least one processor is further configured to:

determine a communication schedule with another node in the mesh network via control information through the Rydberg sensor; and establish point-to-point contact with the other node via the antenna and coupler configured for a narrow frequency.

17. The computer apparatus of claim 16, wherein:

the communication schedule is negotiated via relay through a neighboring node; and the at least one Rydberg sensor comprises a first Rydberg sensor configured for a first spectrum range and a second Rydberg sensor configured for a second spectrum range.

* * * * *